(12) United States Patent
Li et al.

(10) Patent No.: US 12,193,289 B2
(45) Date of Patent: Jan. 7, 2025

(54) DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventors: Yanyang Li, Wuhan (CN); Shaojing Wu, Wuhan (CN); Xiaoguang Zhu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 456 days.

(21) Appl. No.: 17/623,872

(22) PCT Filed: Dec. 17, 2021

(86) PCT No.: PCT/CN2021/139078
§ 371 (c)(1),
(2) Date: Dec. 29, 2021

(87) PCT Pub. No.: WO2023/103034
PCT Pub. Date: Jun. 15, 2023

(65) Prior Publication Data
US 2023/0189582 A1 Jun. 15, 2023

(30) Foreign Application Priority Data

Dec. 9, 2021 (CN) .......................... 202111518036.5

(51) Int. Cl.
*H10K 59/131* (2023.01)
*H10K 59/35* (2023.01)

(52) U.S. Cl.
CPC ......... *H10K 59/131* (2023.02); *H10K 59/351* (2023.02); *H10K 59/353* (2023.02)

(58) Field of Classification Search
CPC .. H10K 59/131; H10K 59/351; H10K 59/353; G09G 3/3208; G09G 2300/0408
See application file for complete search history.

(56) References Cited

U.S. PATENT DOCUMENTS

2014/0117320 A1    5/2014  Jung
2018/0331124 A1*  11/2018  Cho ..................... H10K 59/126
(Continued)

FOREIGN PATENT DOCUMENTS

| CN | 104218042 A | 12/2014 |
| CN | 106057820 A | 10/2016 |

(Continued)

OTHER PUBLICATIONS

PCT International Search Report for International Application No. PCT/CN2021/139078, mailed on Aug. 29, 2022.
(Continued)

*Primary Examiner* — Mohsen Ahmadi
(74) *Attorney, Agent, or Firm* — The Roy Gross Law Firm, LLC; Roy Gross

(57) ABSTRACT

A display panel is provided. The display panel includes a display area and a non-display area adjacent to the display area. The display panel includes a substrate and a driving circuit layer disposed on the substrate. The driving circuit layer includes a plurality of data lines located in the display area and extending along a first direction, and a plurality of first traces located at least partially in the display area and electrically connected to the data lines and a driving chip. A connecting hole(s) of the first traces and the data lines is located in the display area.

19 Claims, 11 Drawing Sheets

(56) References Cited

U.S. PATENT DOCUMENTS

| | | |
|---|---|---|
| 2021/0050536 A1 | 2/2021 | Woo et al. |
| 2021/0223878 A1* | 7/2021 | Wang .................... G06F 3/0412 |
| 2022/0019328 A1* | 1/2022 | Li ......................... G06F 3/0443 |
| 2024/0038773 A1* | 2/2024 | Jiang .................... H10K 59/131 |
| 2024/0164173 A1* | 5/2024 | Xu ......................... H10K 59/40 |

FOREIGN PATENT DOCUMENTS

| | | |
|---|---|---|
| CN | 107680976 A | 2/2018 |
| CN | 108254984 A | 7/2018 |
| CN | 112310125 A | 2/2021 |
| CN | 113299693 A | 8/2021 |
| CN | 214098387 U | 8/2021 |
| CN | 113345931 A | 9/2021 |
| CN | 113410278 A | 9/2021 |
| CN | 113539108 A | 10/2021 |

OTHER PUBLICATIONS

PCT Written Opinion of the International Search Authority for International Application No. PCT/CN2021/139078, mailed on Aug. 29, 2022.

Chinese Office Action issued in corresponding Chinese Patent Application No. 202111518036.5, dated Jan. 20, 2023, pp. 1-6.

* cited by examiner

DISPLAY PANEL

CROSS REFERENCE TO RELATED APPLICATIONS

This application is a National Phase of PCT Patent Application No. PCT/CN2021/139078 having International filing date of Dec. 17, 2021, which claims the benefit of priority of Chinese Application No. 202111518036.5 filed on Dec. 9, 2021. The contents of the above applications are all incorporated by reference as if fully set forth herein in their entirety.

BACKGROUND OF THE INVENTION

Field of the Invention

The present disclosure relates to a field of display technology, and more specifically to a display panel.

Background of the Invention

As the proportion of the display area of an organic light-emitting diode (OLED) display panel continues to increase, the edge size continues to decrease, the design space left to the edge continues to be compressed, and the edge of the display panel is designed with special shapes, original conventional designs can no longer meet current design requirements.

The part of the display panel that takes up a relatively large proportion of a marginal space is the part where signal lines drawn from a driver chip enter the display area. Generally, the drawn signal lines are distributed in a fan shape, which is also called fan-out wiring. At present, fan-out wirings are all located in the non-display area, thereby it is difficult to further compress the area of the non-display area. In recent years, in order to compress the wiring space of the fan-out wiring, it has been proposed to improve the line width and line spacing of the fan-out wiring in the process. However, the effect thereof is limited, and it is still difficult to meet the narrow bezel requirements of current display devices.

There is a technical problem which is difficult to further compress the wiring space of the fan-out traces in the existing display panel.

SUMMARY OF THE INVENTION

The present disclosure provides a display panel for easing a technical problem which is difficult to further compress the wiring space of fan-out traces in the existing display panel.

The present disclosure provides a display panel, which includes a display area and a non-display area adjacent to the display area. The display panel includes:
  a substrate; and
  a driving circuit layer disposed on the substrate, the driving circuit layer including:
    a plurality of data lines located in the display area and extending along a first direction; and
    a plurality of first traces located at least partially in the display area and electrically connected to the data lines and a driving chip,
wherein a connecting hole(s) of the first traces and the data lines is located in the display area.

In the display panel of the present disclosure, the number of the connecting hole(s) of each of the first traces and each of the data lines is greater than or equal to 1.

In the display panel of the present disclosure, orthographic projections of the first traces, which are located in the display area and extend along the first direction, projected on a layer where the data lines are located overlap the data lines.

In the display panel of the present disclosure, lengths of the first traces are equal to each other in the display area.

In the display panel of the present disclosure, the driving circuit layer further includes a plurality of second traces located in the display area and electrically insulated from the driving chip and the first traces, and extension lines of the first traces extending along the first direction overlap at least part of the second traces.

The display panel includes a first sub-pixel and a second sub-pixel, which are arranged along the first direction, the first sub-pixel includes at least one of the first traces extending along the first direction, the second sub-pixel includes at least one of the second traces extending along the first direction, and one or more of the second traces located in the second sub-pixel and extending along the first direction overlap the extension line(s) of one or more of the first traces located in the first sub-pixel and extending along the first direction;

the display panel further includes a third sub-pixel and a fourth sub-pixel, which are arranged along a second direction, and the total number of the first traces and the second traces extending along the first direction contained in the third sub-pixel is greater than or equal to the total number of the first traces and the second traces extending along the first direction contained in the fourth sub-pixel.

In the display panel of the present disclosure, the third sub-pixel includes at least one of the first traces extending along the second direction, the fourth sub-pixel includes at least one of the second traces extending along the second direction, and one or more of the second traces located in the fourth sub-pixel and extending along the second direction overlap the extension line(s) of one or more of the first traces located in the third sub-pixel and extending along the second direction.

In the display panel of the present disclosure, the total number of the first traces and the second traces extending along the second direction contained in the first sub-pixel is greater than or equal to the total number of the first traces and the second traces extending along the second direction contained in the second sub-pixel.

In the display panel of the present disclosure, the number of the first traces extending along the first direction contained in the third sub-pixel is greater than the number of the first traces extending along the first direction contained in the fourth sub-pixel, and the number of the second traces extending along the first direction contained in the third sub-pixel is less than the number of the second traces extending along the first direction contained in the fourth sub-pixel.

In the display panel of the present disclosure, the total number of the first traces and the second traces extending along the first direction contained in the third sub-pixel is equal to the total number of the first traces and the second traces extending along the first direction contained in the fourth sub-pixel.

In the display panel of the present disclosure, the number of the first traces extending along the second direction contained in the third sub-pixel is greater than the number of the first traces extending along the second direction contained in the fourth sub-pixel, and the number of the second traces extending along the second direction contained in the third sub-pixel is less than the number of the second traces extending along the second direction contained in the fourth sub-pixel.

In the display panel of the present disclosure, the total number of the first traces and the second traces extending along the second direction contained in the third sub-pixel is equal to the total number of the first traces and the second traces extending along the second direction contained in the fourth sub-pixel.

In the display panel of the present disclosure, the number of the first traces extending along the first direction contained in the first sub-pixel is greater than the number of the first traces extending along the first direction contained in the second sub-pixel, and the number of the second traces extending along the first direction contained in the first sub-pixel is less than the number of the second traces extending along the first direction contained in the second sub-pixel.

In the display panel of the present disclosure, the total number of the first traces and the second traces extending along the first direction contained in the first sub-pixel is equal to the total number of the first traces and the second traces extending along the first direction contained in the second sub-pixel.

In the display panel of the present disclosure, the number of the first traces extending along the second direction contained in the first sub-pixel is greater than the number of the first traces extending along the second direction contained in the second sub-pixel, and the number of the second traces extending along the second direction contained in the first sub-pixel is less than the number of the second traces extending along the second direction contained in the second sub-pixel.

In the display panel of the present disclosure, the total number of the first traces and the second traces extending along the second direction contained in the first sub-pixel is equal to the total number of the first traces and the second traces extending along the second direction contained in the second sub-pixel.

In the display panel of the present disclosure, the display panel further includes a fifth sub-pixel and a sixth sub-pixel, which are arranged along the first direction, and the second traces located in the sixth sub-pixel and extending along the first direction overlap extension lines of the second traces located in the fifth sub-pixel and extending along the first direction.

In the display panel of the present disclosure, the display panel further includes a seventh sub-pixel and an eighth sub-pixel, which are arranged along the second direction, and the second traces located in the eighth sub-pixel and extending along the second direction overlap extension lines of the second traces located in the seventh sub-pixel and extending along the second direction.

In the display panel of the present disclosure, the first traces and the second traces are located in a same metal layer in the driving circuit layer.

In the display panel of the present disclosure, the display panel further includes a light-emitting layer disposed on the driving circuit layer, the light-emitting layer includes a positive electrode; and a distance between an edge of an orthographic projection of the positive electrode projected on the driving circuit layer and the connecting hole(s) is greater than 0.

The present disclosure provides a display panel. The display panel includes the display area and the non-display area adjacent to the display area. The display panel includes the substrate and the driving circuit layer disposed on the substrate. The driving circuit layer includes: the data lines located in the display area and extending along the first direction; and the first traces located at least partially in the display area and electrically connected to the data lines and the driving chip. The connecting hole(s) of the first traces and the data lines is located in the display area. In the present disclosure, an area occupied by the first traces in the non-display area is reduced by disposing the first traces for connecting the data lines and the driving chip into the display area, and disposing the connecting hole(s) of the first traces and the data lines into the display area, thereby reducing a need for the wiring space of the non-display area for the first trace, so as to reduce the border width of the display panel.

BRIEF DESCRIPTION OF THE DRAWINGS

To describe the technical solutions in the embodiments more clearly, the following briefly introduces the accompanying drawings required for describing the embodiments or the prior art. The accompanying drawings in the following description show merely some embodiments of the present disclosure, and persons of ordinary skill in the art may still derive other drawings from the accompanying drawings without creative efforts.

DETAILED DESCRIPTION OF THE PREFERRED EMBODIMENTS

Figure 1:
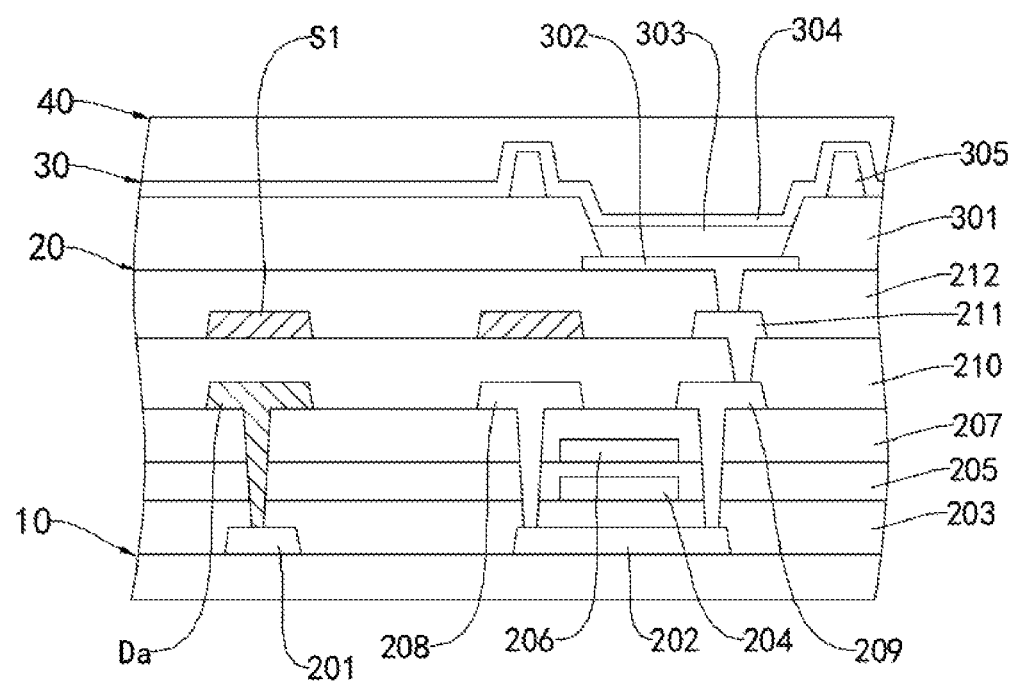
FIG. 1 is a partial sectional view of a display panel according to an embodiment of the present disclosure.

In the following detailed description of the preferred embodiments, reference is made to the accompanying drawings which form a part hereof, and in which is shown by way of illustration specific embodiments in which the disclosure may be practiced. In this regard, directional terminology, such as "top", "bottom", "front", "back", "left", "right", "inside", "outside", "side", etc., is used with reference to the orientation of the figure(s) being described. As such, the directional terminology is used for purposes of illustration and is in no way limiting. Throughout this specification and in the drawings like parts will be referred to by the same reference numerals.

The embodiment of the present disclosure provides a display panel. The display panel includes a display area and a non-display area adjacent to the display area. The display panel includes a substrate and a driving circuit layer disposed on the substrate. The driving circuit layer includes: a plurality of data lines located in the display area and extending along a first direction; and a plurality of first traces located at least partially in the display area and electrically connected to the data lines and a driving chip. A connecting hole(s) of the first traces and the data lines is located in the display area. In the present disclosure, an area occupied by the first traces in the non-display area is reduced by disposing the first traces for connecting the data lines and the driving chip into the display area, and disposing the connecting hole(s) of the first traces and the data lines into the display area, thereby reducing a need for the wiring space of the non-display area for the first trace, so as to reduce the border width of the display panel.

Further, the display panel further includes a plurality of second traces located in the display area and electrically insulated from the driving chip and the first traces. In a first sub-pixel and a second sub-pixel which are arranged along the first direction, the first sub-pixel includes at least one of the first traces extending along the first direction, the second sub-pixel includes at least one of the second traces extending along the first direction, and one or more of the second traces located in the second sub-pixel and extending along the first direction overlap the extension line(s) of one or more of the first traces located in the first sub-pixel and extending along the first direction. In a third sub-pixel and a fourth sub-pixel which are arranged along a second direction, the total number of the first traces and the second traces extending along the first direction contained in the third sub-pixel is greater than or equal to the total number of the first traces and the second traces extending along the first direction contained in the fourth sub-pixel. In the embodiment of the present disclosure, the second traces are used for making up a defect, which an uneven distribution of traces is caused by setting up the first traces in the display area, by setting the second traces located in the second sub-pixel and extending along the first direction to overlap with the extension line(s) of the first traces located in the first sub-pixel and extending along the first direction, and setting the total number of the first traces and the second traces extending along the first direction in the third sub-pixel to be greater than or equal to the total number of the first traces and the second traces extending along the first direction in the fourth sub-pixel, thereby improving the uniformity of trace distribution in the display area, so that it is advantageous to improve the display quality of the display panel.

Figure 2:
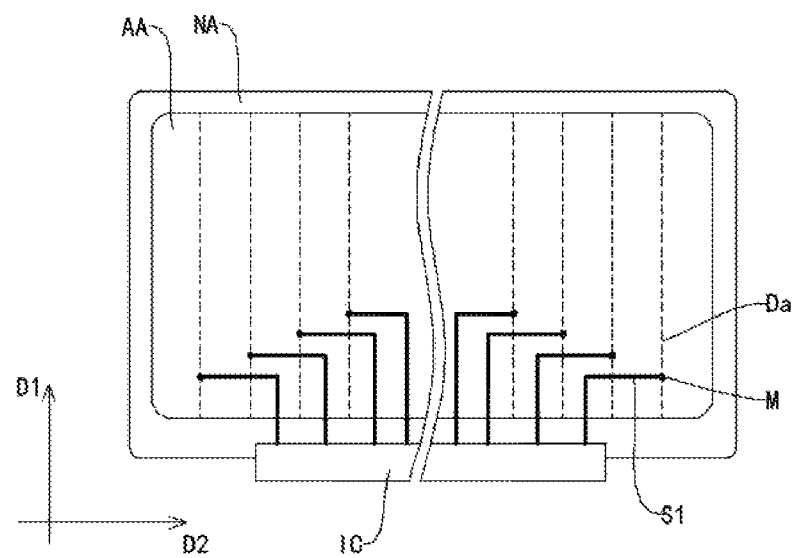
FIG. 2 is a schematic view of a first wiring structure of first traces of a display panel according to an embodiment of the present disclosure.
Figure 3:
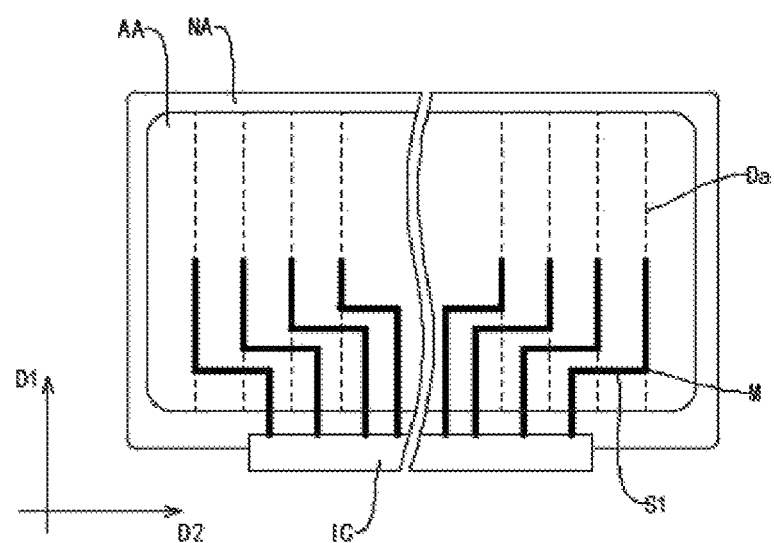
FIG. 3 is a schematic view of a second wiring structure of first traces of a display panel according to an embodiment of the present disclosure.
Figure 4:
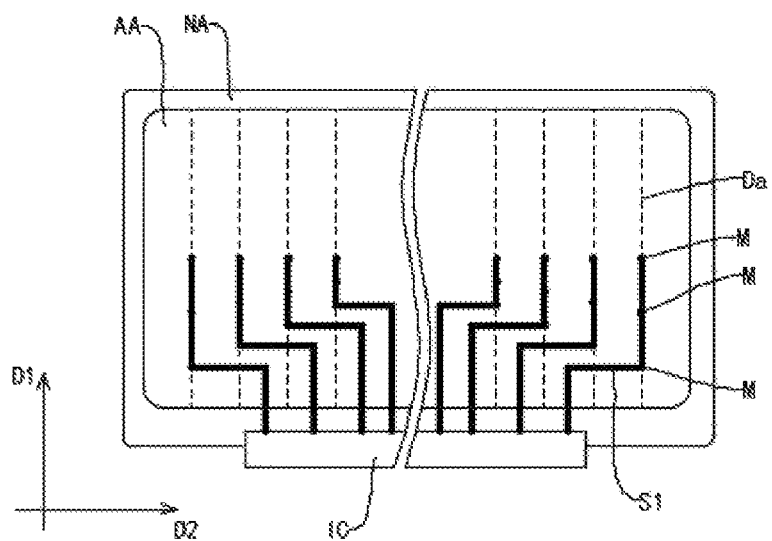
FIG. 4 is a schematic view of a third wiring structure of first traces of a display panel according to an embodiment of the present disclosure.

Please refer to FIGS. 1 to 4. FIG. 1 is a partial sectional view of a display panel according to an embodiment of the present disclosure. FIG. 2 is a schematic view of a first wiring structure of first traces of a display panel according to an embodiment of the present disclosure. FIG. 3 is a schematic view of a second wiring structure of first traces of a display panel according to an embodiment of the present disclosure. FIG. 4 is a schematic view of a third wiring structure of first traces of a display panel according to an embodiment of the present disclosure.

The embodiment of the present disclosure provides a display panel. The display panel includes a display area AA and a non-display area NA adjacent to the display area AA. There is a plurality of sub-pixels for implementing the display function of the display panel in the display area AA of the display panel. For example, the sub-pixels include red sub-pixels, green sub-pixels, blue sub-pixels, and the like. Each of the sub-pixels has a specific shape of a distribution area. It should be understood that the display area AA of the display panel is formed by combining the plurality of the sub-pixels according to a certain distribution law, and the display functions of the display panel are implemented under the coordinated light emission of the plurality of the sub-pixels. There are a variety of elements for assisting the display functions of the display panel in the non-display area NA of the display panel, such as a driving chip which provides data driving signals to the sub-pixels in the display area AA, and the like.

The display panel includes a substrate 10, a driving circuit layer 20 disposed on the substrate 10, a light-emitting layer 30 disposed on the driving circuit layer 20, and an encapsulating layer 40 disposed on the light-emitting layer 30. Optionally, the substrate 10 can include a substrate layer and a buffer layer disposed on the substrate layer. The substrate layer can be a glass substrate and the like. The buffer layer can be a composite layer stacked by a polyimide layer, an inorganic layer, and another polyimide layer.

There are a driving circuit and many types of traces, a plurality of thin film transistors, and a plurality of input/output ends, which are used for achieving the driving circuit in the driving circuit layer 20. The driving circuit layer 20 is used for providing driving signals and control signals to various light-emitting elements in the light-emitting layer 30.

Specifically, the driving circuit layer 20 includes: a connecting trace 201 and a semiconductor layer 202 disposed on the substrate 10; a first gate insulation layer 203 covering the connecting trace 201 and the semiconductor layer 202; a first gate electrode 204 disposed on the first gate insulation layer 203; a second gate insulation layer 205 covering the first gate electrode 204; a second gate electrode 206 disposed on the second gate insulation layer 205; an interlayer insulation layer 207 covering the second gate electrode 206; a plurality of data lines Da, a source electrode 208, and a drain electrode 209 disposed on the interlayer insulation layer 207; a passivation layer 210 covering the data lines Da, the source electrode 208, and the drain electrode 209; a plurality of first traces S1 and a drain switch wire 211 disposed on the passivation layer 210; and a planar layer 212 covering the first traces S1 and the drain switch wire 211. The data lines Da is electrically connected to the connecting trace 201. The source electrode 208 and the drain electrode 209 are electrically connected to the opposite ends of the semiconductor layer 202, respectively. The drain switch wire 211 is electrically connected to the drain electrode 209.

Each of the first traces S1 is electrically connected to each of the data lines Da. The data lines Da are extend and arranged along a first direction D1. In the display area AA, orthographic projections of the first traces S1, which are extend along the first direction D1, projected on a layer where the data lines Da are located overlap the data lines Da, so as to achieve an electrical connection between the first traces S1 and the data lines Da through a connecting hole(s) M, and achieve that the connecting hole(s) M is disposed in the display area AA, thereby further simplifying the edge wiring complexity of the display panel, and reducing the border width of the display panel.

It should be understood that the position relationship of all traces in the driving circuit layer 20 can be adjusted as required, for example, the data lines Da can also be located in the same metal layer as the first gate electrode 204 or the second gate electrode 206.

There are a plurality of light-emitting elements in the light-emitting layer 30 of the display panel. The display area where each of the light-emitting elements and the driving circuit connected to thereof are located is a sub-pixel area or is called a sub-pixel. The light-emitting layer 30 includes: a pixel definition layer 301 disposed on the planar layer 212; a positive electrode 302 disposed on the planar layer 212 and exposed by an opening of the pixel definition layer 301; a light-emitting function layer 303 disposed in the opening of the pixel definition layer 301 and contacted to the positive electrode 302; a negative electrode 304 disposed on the pixel definition layer 301 and contacted to the light-emitting function layer 303; and a supporting pillar 305 disposed on the pixel definition layer 301. The positive electrode is electrically connected to the drain switch wire 211. The positive electrode 302, the light-emitting function layer 303, and the negative electrode 304 disposed corresponding the opening of the pixel definition layer 301 construct one light-emitting element. The light-emitting element can be an organic light emitting diode.

Further, a distance between an edge of an orthographic projection of the positive electrode 302 projected on the driving circuit layer 20 and the connecting hole(s) M is greater than 0. The design of the embodiment can realize that the setting positions of the positive electrode 302 and the connecting hole(s) M in the thickness direction of the display panel are staggered, and thereby it is advantageous to improve the flatness of the display panel.

The encapsulating layer 40 completely covers the light-emitting layer 30. The encapsulating layer 40 is used for sealing and protecting the light-emitting layer 30. The encapsulating layer 40 can be a composite structural layer stacked by an organic layer, an inorganic layer, and another organic layer.

The position and connection relationship of the data lines Da and the first traces S1 in the display panel will be described with reference to FIGS. 2 to 3.

Please refer to FIG. 2. In one embodiment, the data lines Da are distributed in the display area AA of the display panel, extend along the first direction D1, and arranged along a second direction D2. The first direction D1 and the second direction D2 can be two directions which are perpendicular to each other. Each of the data lines Da is corresponding to a column of sub-pixels in the display panel, and is used for providing data signals to the column of sub-pixels. The first traces S1 are located at least partially in the display area AA, and the opposite ends of each of the first traces S1 are electrically connected to each of the data lines Da and a driving chip IC, respectively. Each of the first traces S1 is electrically connected to each of the data lines Da. The driving chip IC is located in the non-display area NA of the display panel. The driving chip IC provides the data signals to the data lines Da through the first traces S1, so as to control the display functions of the display panel. In the embodiment of FIG. 2, there is one connecting hole M between each of the first traces S1 and each of the data lines Da, and one end of each of the first traces S1 ends at the connecting hole M. It should be understood that the space occupied by the first traces S1 on the non-display area NA can be reduced by arranging the first traces S1 for connecting the driving chip IC and the data lines Da into the display area AA, and thereby it is advantageous to reduce the edge width of the display panel, so as to achieve a narrow bezel design.

Please refer to FIG. 3. In another embodiment, the data lines Da are distributed in the display area AA of the display panel, extend along the first direction D1, and arranged along the second direction D2. Each of the data lines Da is corresponding to a column of sub-pixels in the display panel, and is used for providing data signals to the column of sub-pixels. The first traces S1 are located at least partially in the display area AA, and each of the first traces S1 is electrically connected to each of the data lines Da and the driving chip IC. The driving chip IC is located in the non-display area NA of the display panel. The driving chip IC provides the data signals to the data lines Da through the first traces S1, so as to control the display functions of the display panel. In an embodiment, there is one connecting hole M between each of the first traces S1 and each of the data lines Da. Also, each of the first traces S1 extends a distance from the connecting hole M along each of the data lines Da, thereby realizing that the lengths of the plurality of the first traces S1 in the display area AA are equal, so as to avoid a difference in a load capacity caused by the first traces S1 of different lengths, and thereby it is advantageous to improve the display uniformity of the display panel.

Please refer to FIG. 4. In another embodiment, the data lines Da are distributed in the display area AA of the display panel, extend along the first direction D1, and arranged along the second direction D2. Each of the data lines Da is corresponding to a column of sub-pixels in the display panel, and is used for providing data signals to the column of sub-pixels. The first traces S1 are located at least partially in the display area AA, and each of the first traces S1 is electrically connected to each of the data lines Da and the driving chip IC. The driving chip IC is located in the non-display area NA of the display panel. The driving chip IC provides the data signals to the data lines Da through the first traces S1, so as to control the display functions of the display panel. In an embodiment, there are a plurality of connecting holes M between each of the first traces S1 and each of the data lines Da (FIG. 4 only shows a case where there are three connecting holes M, but the present disclosure is not limited thereto), in which each of the first traces S1 extends a distance from first connecting hole M between each of the first traces S1 and each of the data lines Da along each of the data lines Da, and more connecting holes M are disposed between the extended portion of each of the first traces S1 and each of the data lines Da. In the embodiment, while realizing that the lengths of the plurality of the first traces S1 in the display area AA are equal, the number of connecting holes M between the first traces S1 and the data lines Da is increased, the balance of signals received by the data lines Da through the first traces S1 is improved, and thereby it is advantageous to improve the display uniformity of the display panel; and the design of the plurality of the connecting holes M in the embodiment is also advantageous to arrange the first traces S1 into different layers according to needs, realize an electrical connection between the data lines Da and the first traces S1 and realize an electrical connection between the first traces S1 in different layers through the plurality of the connecting holes M.

Further, please refer to FIGS. 5 to 19. The display panel further includes a plurality of second traces S2 located in the display area AA and electrically insulated from the driving chip IC and the first traces S1. It should be understood that the second traces S2 is only distributed in the display area AA according to a specific rule, do not have a signal transmission function, and is only used to balance the uneven distribution of the first traces S1 in the display area AA; the second traces S2 and the first traces S1 can be located together in the same metal layer in the display panel. In order to further clearly explain the position relationship of the first traces S1, the second traces S2, and the data lines Da in the display panel with respect to each sub-pixel P in the display panel, the illustration and explanation will be given on the scale of each sub-pixel P in the display panel. It should be understood that the sub-pixels P described below can be selected from the display panel shown in any one of FIGS. 2 to 4, and can have the characteristics of the layer structure shown in FIG. 1.

Figure 5:
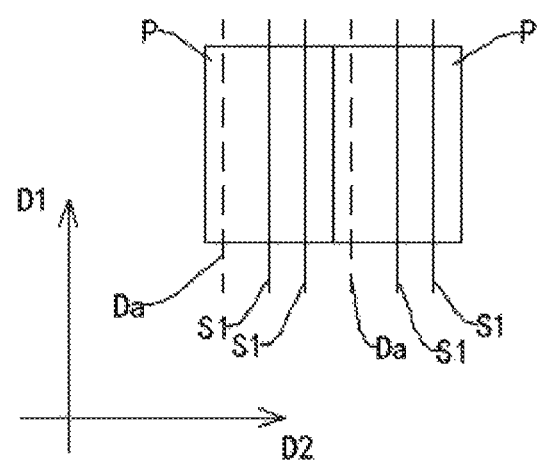
FIG. 5 is a first layout diagram of first traces in two adjacent sub-pixels in a display panel according to an embodiment of the present disclosure.
Figure 6:
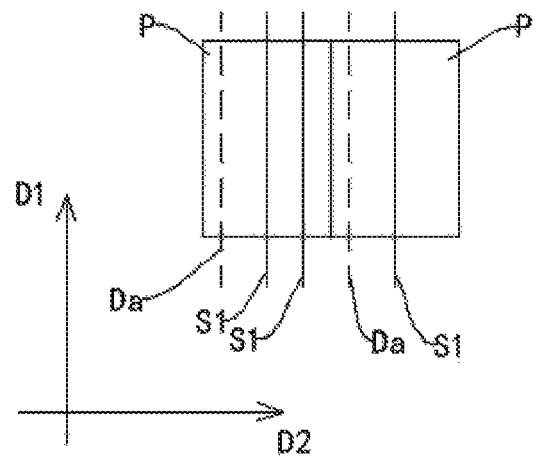
FIG. 6 is a second layout diagram of first traces in two adjacent sub-pixels in a display panel according to an embodiment of the present disclosure.
Figure 7:
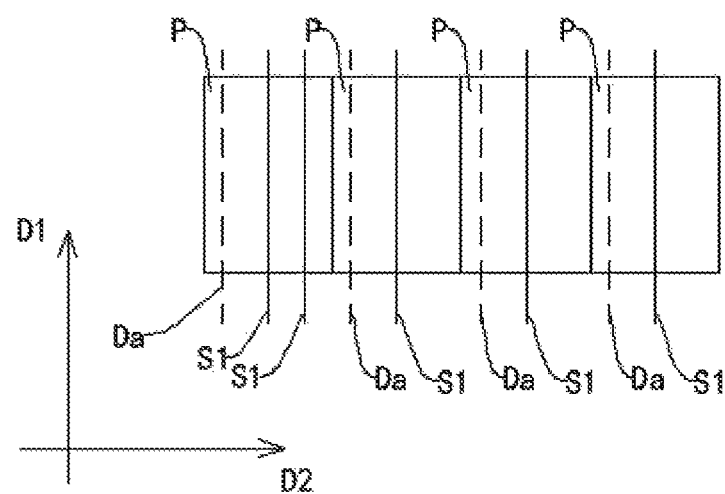
FIG. 7 is a third layout diagram of first traces in two adjacent sub-pixels in a display panel according to an embodiment of the present disclosure.

Please refer to FIGS. 5 to 7. FIGS. 5 to 7 respectively show three different distribution laws of the corresponding data lines Da and first traces S1 in two or more sub-pixels P arranged adjacently along the second direction D2 in the display panel. FIG. 5 shows that the first traces S1 in two sub-pixels P adjacent to each other along the second direction D2 have the same distribution characteristics. It should be understood that in the display panel, part or most of the sub-pixels P in the area where the first traces S1 is provided have the same distribution law of the first traces S1. FIG. 6 shows the decreasing number of the first traces S1 distributed in two adjacent sub-pixels P arranged along the second direction D2. For example, the numbers of the first traces S1 are 2 and 1, respectively, and the distribution law cyclically recurs in the area where the first traces S1 is provided in the display panel. FIG. 7 shows that four sub-pixels P adjacent to each other along the second direction D2 form a group, and the number of the first traces S1 distributed in at least one of the four sub-pixels P in the group is greater than the number of the first traces S1 distributed in the remaining sub-pixels P. For example, the number of the first traces S1 included in the four sub-pixels P are 2, 1, 1, and 1, respectively, and the distribution law cyclically recurs in the area where the first traces S1 is provided in the display panel.

Figure 8:
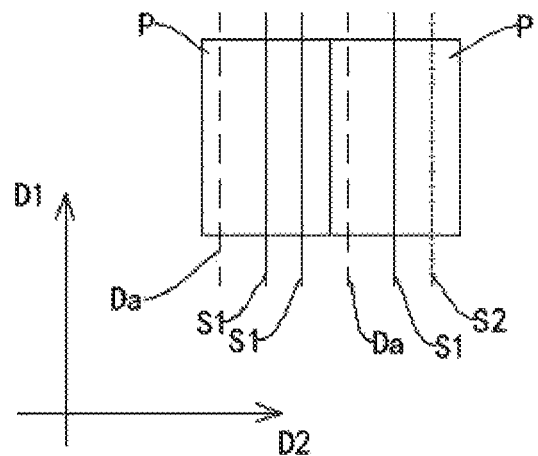
FIG. 8 is a first layout diagram of first traces and second traces in two adjacent sub-pixels in a display panel according to an embodiment of the present disclosure.
Figure 9:
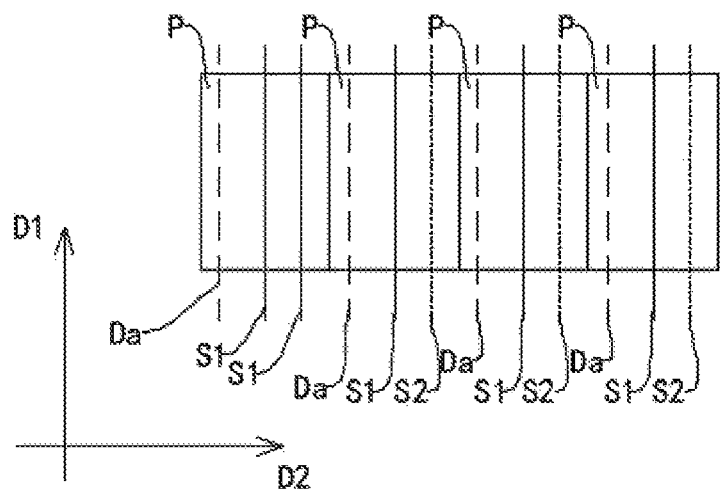
FIG. 9 is a second layout diagram of first traces and second traces in two adjacent sub-pixels in a display panel according to an embodiment of the present disclosure.

Please further refer to FIGS. 8 and 9. FIG. 8 shows the distribution characteristics of the first traces S1 and the second traces S2 in the two sub-pixels P arranged adjacently along the second direction D2 corresponding to FIG. 6. FIG. 9 shows the distribution characteristics of the first traces S1 and the second traces S2 in the four sub-pixels P arranged adjacently along the second direction D2 corresponding to FIG. 7. In the embodiment of FIG. 8, since one of the two adjacent sub-pixels P has fewer first traces S1 than the other, the second traces S2 are provided in the sub-pixels P with fewer first traces S1, so as to make up the difference in the trace distribution in the two adjacent sub-pixels P. Also, the position of the added second traces S2 in the sub-pixels P corresponds to the position of the first traces S1 in another sub-pixel P, so that two adjacent sub-pixels P have the same or similar wiring layout. In the embodiment of FIG. 9, among the four adjacent sub-pixels P, the second traces S2 is arranged in the sub-pixel P having a smaller number of the first traces S1, so as to make up the difference in the trace distribution in the four adjacent sub-pixels P. Also, the position of the added second traces S2 in the sub-pixels P corresponds to the position of the first traces S1 in the sub-pixel P of the larger number of the first traces S1, so that four adjacent sub-pixels P have the same or similar wiring layout. It should be understood that the sub-pixel P shown in FIGS. 5 to 9 can be a sub-pixel selected from a partial area in the display panel shown in any one of FIGS. 2 to 4.

The various optional distribution characteristics of the first traces S1 and the second traces S2 corresponding to each sub-pixel P in the display panel will be described below.

Figure 10:
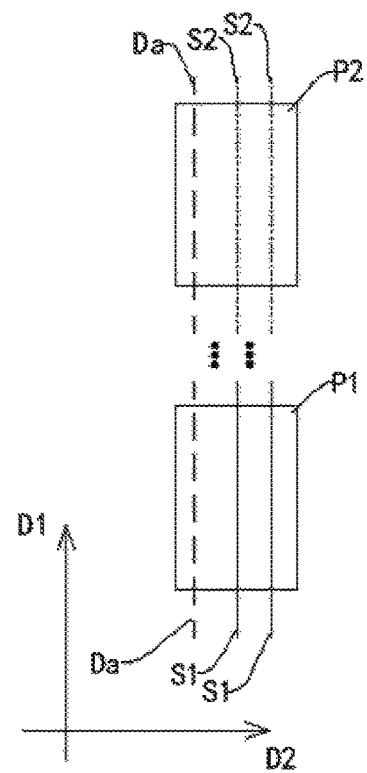
FIG. 10 is a first layout diagram of first traces and second traces in a first sub-pixel and a second sub-pixel in a display panel according to an embodiment of the present disclosure.

Please refer to FIG. 10. In the plurality of sub-pixels of the display panel, two sub-pixels P arranged along the first direction D1 are selected as a first sub-pixel P1 and a second sub-pixel P2, respectively, and the first sub-pixel P1 and the second sub-pixel P2 can be or cannot be adjacent.

The first sub-pixel P1 includes at least one of the first traces S1 extending along the first direction D1. The second sub-pixel P2 includes at least one of the second traces S2 extending along the first direction D1. One or more of the second traces S2 located in the second sub-pixel P2 and extending along the first direction D1 overlap extension lines of one or more of the first traces S1 located in the first sub-pixel P1 and extending along the first direction D1. It should be understood that the distribution positions of the second traces S2 located in the second sub-pixel P2 in the second sub-pixel P2 are the same as the distribution positions of the first traces S1 located in the first sub-pixel P1 in the first sub-pixel P1; and the plurality of the second traces S2 can also be distributed in the second sub-pixel P2 when the plurality of the first traces S1 are distributed in the first sub-pixel P1, and the positions of the plurality of the second traces S2 correspond to the positions of the plurality of the first traces S1, respectively.

Optionally, the number of the first traces S1 extending along the first direction D1 contained in the first sub-pixel P1 is greater than or equal to the number of the second traces S2 extending along the first direction D1 contained in the second sub-pixel P2.

Figure 11:
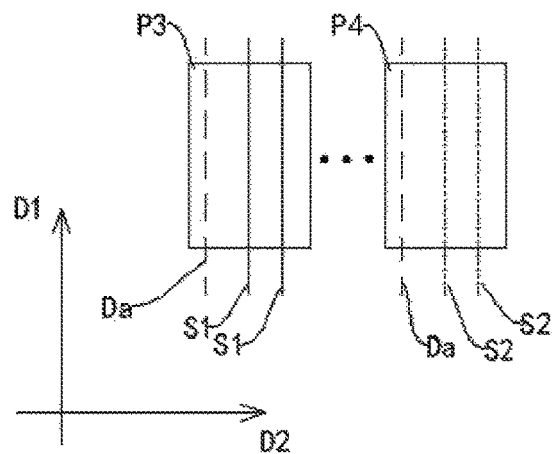
FIG. 11 is a first layout diagram of first traces and second traces in a third sub-pixel and a fourth sub-pixel in a display panel according to an embodiment of the present disclosure.

Further, please refer to FIG. 11. In the plurality of sub-pixels of the display panel, two sub-pixels P arranged along the second direction D2 are selected as a third sub-pixel P3 and a fourth sub-pixel P4, respectively, and the third sub-pixel P3 and the fourth sub-pixel P4 can be or cannot be adjacent. The total number of the first traces S1 and the second traces S2 extending along the first direction D1 contained in the third sub-pixel P3 is greater than or equal to the total number of the first traces S1 and the second traces S2 extending along the first direction D1 contained in the fourth sub-pixel P4.

Optionally, the second traces S2 extending along the first direction D1 is only included in the fourth sub-pixel P4, and the first traces S1 extending along the first direction D1 is only included in the third sub-pixel P3. Also, the second traces S2 located in the fourth sub-pixel P4 and extending along the first direction D1 and the first traces S1 located in the third sub-pixel P3 and extending along the first direction D1 have the same number, and have the same corresponding position.

Figure 12:
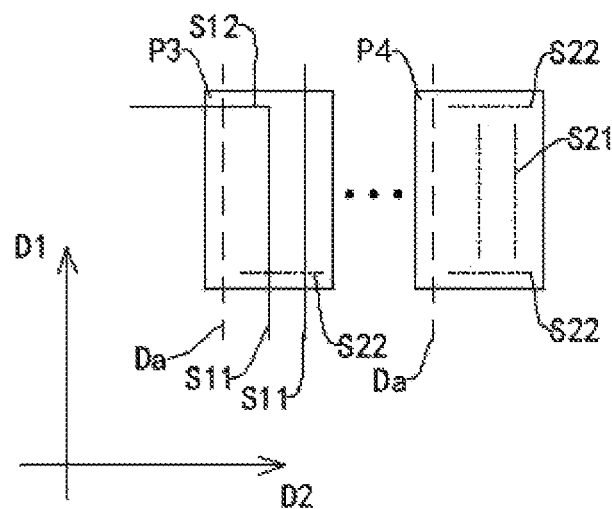
FIG. 12 is a second layout diagram of first traces and second traces in a third sub-pixel and a fourth sub-pixel in a display panel according to an embodiment of the present disclosure.
Figure 13:
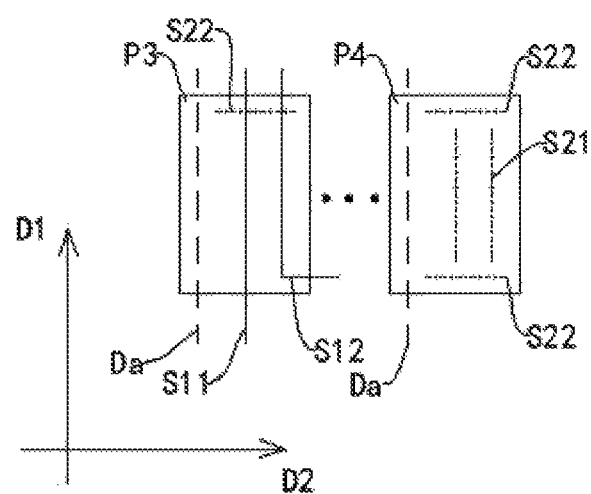
FIG. 13 is a third layout diagram of first traces and second traces in a third sub-pixel and a fourth sub-pixel in a display panel according to an embodiment of the present disclosure.

Please further refer to FIGS. 12 and 13. FIGS. 12 and 13 show two optional wiring structures of the first traces S1 and the second traces S2 in the third sub-pixel P3 and the fourth sub-pixel P4. For the third sub-pixel P3 and the fourth sub-pixel P4 arranged along the second direction D2, the first traces S1 located in the third sub-pixel P3 includes first portions S11 extending along the first direction D1 and second portions S12 extending along the second direction D2, and the second traces S2 located in the fourth sub-pixel P4 includes third portions S21 extending along the first direction D1 and fourth portions S22 extending along the second direction D2. The first portions S11 and the second portions S12 can be or cannot be connected, and the third portions S21 and the fourth portions S22 can be or cannot be connected.

In the present embodiment and the following embodiments, it should be understood that the first traces S1 extending along the first direction D1 can be referred to as the first portions S11 of the first traces S1, the first traces S1 extending along the second direction D2 can be referred to as the second portions S12 of the first traces S1, and the first portions S11 and the second portions S12 can be referred to as one of the first traces S1, respectively. Correspondingly, the second traces S2 extending along the first direction D1 can be referred to as the third portions S21 of the second traces S2, the second traces S2 extending along the second direction D2 can be referred to as the fourth portions S22 of the second traces S2, and the first portions S11 and the fourth portions S22 can be referred to as one of the second traces S2, respectively.

Optionally, the fourth portions S22 or the third portions S21 of the second traces S2 can also be included in the third sub-pixel P3, and the first portions S11 or the second portions S12 of the first traces S1 can also be included in the fourth sub-pixel P4.

The fourth portions S22 of the second traces S2 located in the fourth sub-pixel P4 overlap extension lines of the second portions S12 of the first traces S1 located in the third sub-pixel P3, and thus the setting positions of the traces extending along the second direction in the third sub-pixel P3 and the fourth sub-pixel P4 correspond to each other. Further, for a case where the fourth portions S22 of the second traces S2 are provided in the third sub-pixel P3, the fourth portions S22 of the second traces S2 located in the fourth sub-pixel P4 overlap extension lines of the fourth portions S22 of the second traces S2 located in the third sub-pixel P3.

Further, the number of the first portions S11 of the first traces S1 contained in the third sub-pixel P3 is greater than the number of the first portions S11 of the first traces S1 contained in the fourth sub-pixel P4. The number of the third portions S21 of the second traces S2 contained in the third sub-pixel P3 is less than the number of the third portions S21 of the second traces S2 contained in the fourth sub-pixel P4.

Optionally, in the traces extending along the first direction D1, the third sub-pixel P3 includes the first portions S11 of the first traces S1, but not includes the third portions S21 of the second traces S2; and the fourth sub-pixel P4 includes the third portions S21 of the second traces S2, but not includes the first portions S11 of the first traces S1. On this basis, the number of the first portions S11 of the first traces S1 contained in the third sub-pixel P3 is equal to the number of the third portions S21 of the second traces S2 contained in the fourth sub-pixel P4. Furthermore, the number of the third portions S21 of the second traces S2 contained in the fourth sub-pixel P4 can also be less than the number of the first portions S11 of the first traces S1 contained in the third sub-pixel P3, but a difference value between the two is maintained within 2 to ensure that trace arrangements in the third sub-pixel P3 and the fourth sub-pixel P4 are as close or the same as possible.

Further, the number of the second portions S12 of the first traces S1 contained in the third sub-pixel P3 is greater than the number of the second portions S12 of the first traces S1 contained in the fourth sub-pixel P4. The number of the fourth portions S22 of the second traces S2 contained in the third sub-pixel P3 is less than the number of the fourth portions S22 of the second traces S2 contained in the fourth sub-pixel P4. The total number of the second portions S12 of the first traces S1 and the fourth portions S22 of the second traces S2 contained in the third sub-pixel P3 is equal to the total number of the second portions S12 of the first traces S1 and the fourth portions S22 of the second traces S2 contained in the fourth sub-pixel P4, so as to ensure that trace arrangements in the third sub-pixel P3 and the fourth sub-pixel P4 are the same as possible.

Figure 14:
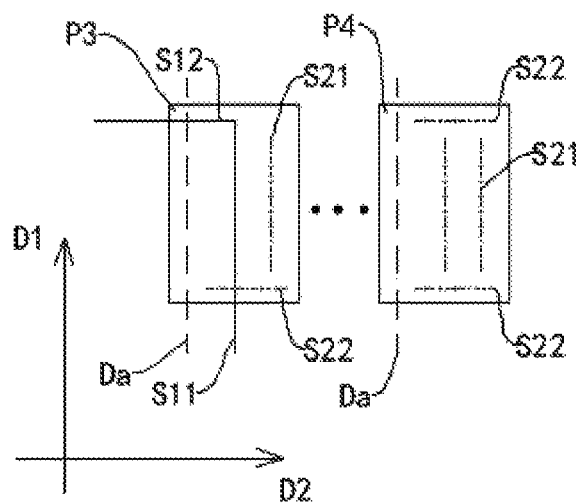
FIG. 14 is a fourth layout diagram of first traces and second traces in a third sub-pixel and a fourth sub-pixel in a display panel according to an embodiment of the present disclosure.
Figure 15:
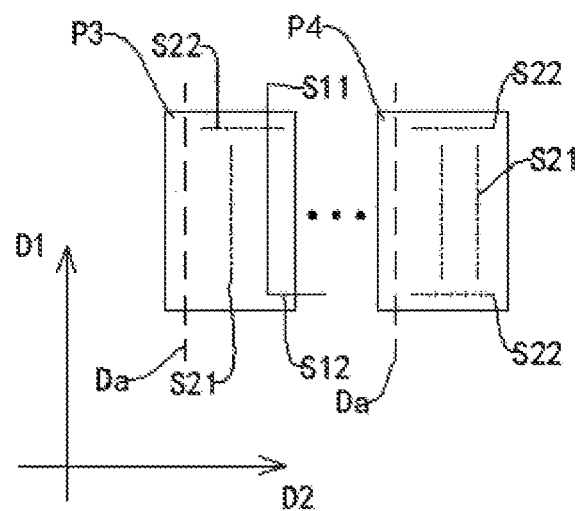
FIG. 15 is a fifth layout diagram of first traces and second traces in a third sub-pixel and a fourth sub-pixel in a display panel according to an embodiment of the present disclosure.

Please further refer to FIGS. 14 and 15. FIGS. 14 and 15 show two other optional wiring structures of the first traces S1 and the second traces S2 in the third sub-pixel P3 and the fourth sub-pixel P4. Different from the wiring structures shown in FIGS. 12 and 13, the third sub-pixel P3 in FIG. 14 or 15 includes the third portion(s) S21 of at least one of the second traces S2. On this basis, the total number of the first portions S11 of the first traces S1 and the third portions S21 of the second traces S2 contained in the third sub-pixel P3 is equal to the total number of the first portions S11 of the first traces S1 and the third portions S21 of the second traces S2 contained in the fourth sub-pixel P4. For other wiring characteristics and quantity characteristics of the first traces S1 and the second traces S2 in the third sub-pixel P3 and the fourth sub-pixel P4, please refer to the description of the wiring structures shown in FIGS. 12 and 13, and therefore will not be repeatedly stated herein.

It should be noted that the wiring structures of the first traces S1 and the second traces S2 in the third sub-pixel P3 and the fourth sub-pixel P4 shown in FIGS. 12 to 15 are only a few of the wiring structures of the first traces S1 and the second traces S2 in the display panel, and other wiring structures are not excluded.

Figure 16:
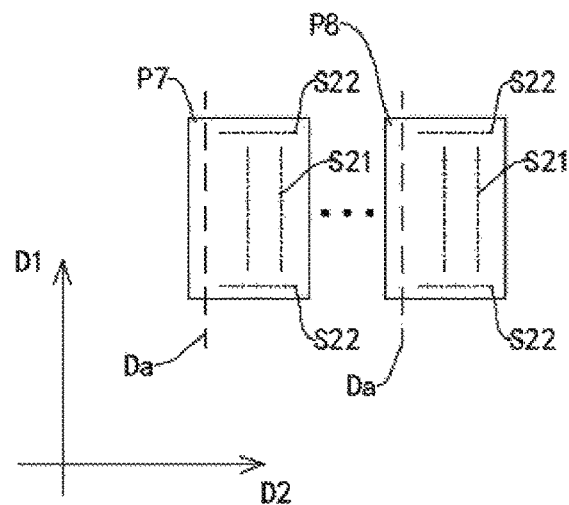
FIG. 16 is a layout diagram of second traces in a seventh sub-pixel and an eighth sub-pixel in a display panel according to an embodiment of the present disclosure.

Please further refer to FIG. 16. The display panel further includes a seventh sub-pixel P7 and an eighth sub-pixel P8, which are arranged along the second direction D2. The seventh sub-pixel P7 and the eighth sub-pixel P8 can be or cannot be adjacent. The fourth portions S22 of the second traces S2 located in the eighth sub-pixel P8 overlap extension lines of the fourth portions S22 of the second traces S2 located in the seventh sub-pixel P7, and the distribution positions of the third portions S21 of the second traces S2 located in the eighth sub-pixel P8 and the third portions S21 of the second traces S2 located in the seventh sub-pixel P7 in the corresponding sub-pixels are the same. It should be understood that the seventh sub-pixel P7 and the eighth sub-pixel P8 selected in the embodiment are both sub-pixels without the first traces S1, and the positions of the second traces S2 in such sub-pixels are the same, so as to ensure that wiring layouts in the corresponding sub-pixels are consistent.

Further, the number of the third portions S21 of the second traces S2 contained in the seventh sub-pixel P7 is equal to the number of the third portions S21 of the second traces S2 contained in the eighth sub-pixel P8, and the number of the fourth portions S22 of the second traces S2 contained in the seventh sub-pixel P7 is equal to the number of the fourth portions S22 of the second traces S2 contained in the eighth sub-pixel P8, so as to further ensure the consistency of a wiring layout in the seventh sub-pixel P7 and the eighth sub-pixel P8.

Figure 17:
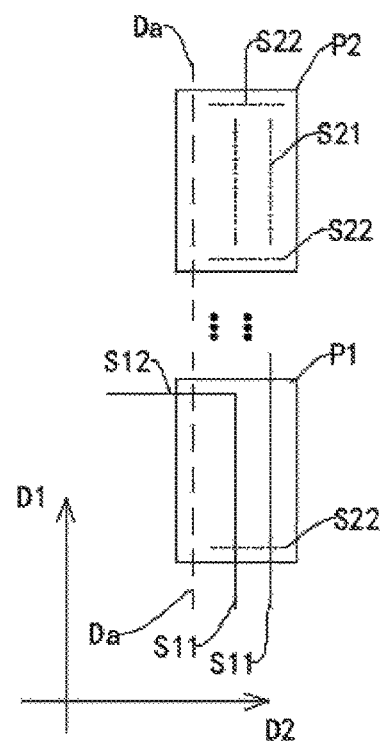
FIG. 17 is a second layout diagram of first traces and second traces in a first sub-pixel and a second sub-pixel in a display panel according to an embodiment of the present disclosure.
Figure 18:
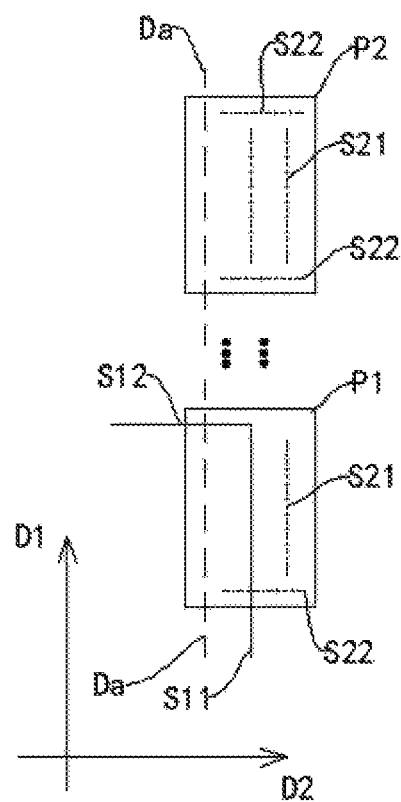
FIG. 18 is a third layout diagram of first traces and second traces in a first sub-pixel and a second sub-pixel in a display panel according to an embodiment of the present disclosure.

Please further refer to FIGS. 17 and 18. FIGS. 17 and 18 show two optional wiring structures of the first traces S1 and the second traces S2 in the first sub-pixel P1 and the second sub-pixel P2. For the first sub-pixel P1 and the second sub-pixel P2 arranged along the first direction D1, the third portions S21 of the second traces S2 located in the second sub-pixel P2 overlap extension lines of the first portions S11 of the first traces S1 located in the first sub-pixel P1, and thus the setting positions of the traces extending along the first direction in the first sub-pixel P1 and the second sub-pixel P2 correspond to each other.

Further, for a case where the third portions S21 of the second traces S2 are provided in the first sub-pixel P1 as shown in FIG. 18, the third portions S21 of the second traces S2 located in the second sub-pixel P2 overlap extension lines of the third portions S21 of the second traces S2 located in the first sub-pixel P1.

Further, the number of the second portions S12 of the first traces S1 contained in the first sub-pixel P1 is greater than the number of the second portions S12 of the first traces S1 contained in the second sub-pixel P2, and the number of the fourth portions S22 of the second traces S2 contained in the first sub-pixel P1 is less than the number of the fourth portions S22 of the second traces S2 contained in the second sub-pixel P2.

Optionally, in the traces extending along the first direction D1, the first sub-pixel P1 includes the first portions S11 of the first traces S1, but not includes the third portions S21 of the second traces S2; and the second sub-pixel P2 includes the third portions S21 of the second traces S2, but not includes the first portions S11 of the first traces S1. On this basis, the number of the first portions S11 of the first traces S1 contained in the first sub-pixel P1 is equal to the number of the third portions S21 of the second traces S2 contained in the second sub-pixel P2. Or, the number of the third portions S21 of the second traces S2 contained in the second sub-pixel P2 can also be less than the number of the first portions S11 of the first traces S1 contained in the first sub-pixel P1, but a difference value between the two is maintained within 2 to ensure that trace arrangements in the first sub-pixel P1 and the second sub-pixel P2 are as close or the same as possible.

Further, the number of the first portions S11 of the first traces S1 contained in the first sub-pixel P1 is greater than the number of the first portions S11 of the first traces S1 contained in the second sub-pixel P2, and the number of the third portions S21 of the second traces S2 contained in the first sub-pixel P1 is less than the number of the third portions S21 of the second traces S2 contained in the second sub-pixel P2. The total number of the first portions S11 of the first traces S1 and the third portions S21 of the second traces S2 contained in the first sub-pixel P1 is equal to the total number of the first portions S11 of the first traces S1 and the third portions S21 of the second traces S2 contained in the second sub-pixel P2, so as to ensure that trace arrangements in the first sub-pixel P1 and the second sub-pixel P2 are the same as possible.

It should be noted that the wiring structures of the first traces S1 and the second traces S2 in the first sub-pixel P1 and the second sub-pixel P2 shown in FIGS. 17 to 18 are only a few of the wiring structures of the first traces S1 and the second traces S2 in the display panel, and other wiring structures are not excluded.

Figure 19:
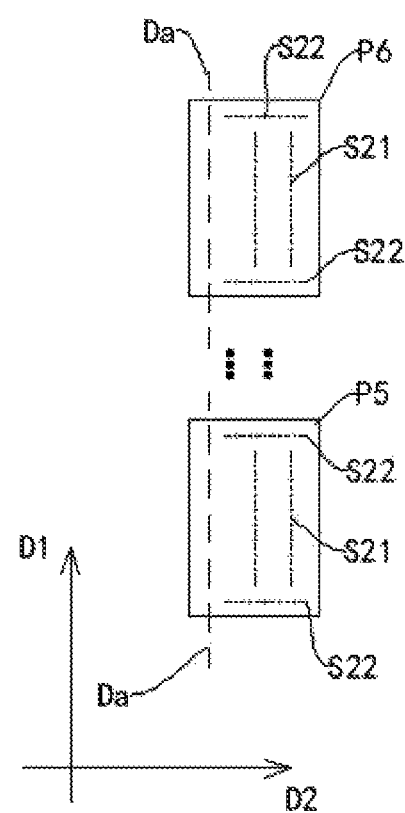
FIG. 19 is a layout diagram of second traces in a fifth sub-pixel and a sixth sub-pixel in a display panel according to an embodiment of the present disclosure.

Please further refer to FIG. 19. The display panel further includes a fifth sub-pixel P5 and a sixth sub-pixel P6, which are arranged along the first direction D1. The fifth sub-pixel P5 and the sixth sub-pixel P6 can be or cannot be adjacent. The third portions S21 of the second traces S2 located in the sixth sub-pixel P6 overlap extension lines of the third portions S21 of the second traces S2 located in the fifth sub-pixel P5, and the distribution positions of the fourth portions S22 of the second traces S2 located in the sixth sub-pixel P6 and the fourth portions S22 of the second traces S2 located in the fifth sub-pixel P5 in the corresponding sub-pixels are the same. It should be understood that the fifth sub-pixel P5 and the sixth sub-pixel P6 selected in the embodiment are both sub-pixels without the first traces S1, and the positions of the second traces S2 in such sub-pixels are the same, so as to ensure that wiring layouts in the corresponding sub-pixels are consistent.

Further, the number of the third portions S21 of the second traces S2 contained in the fifth sub-pixel P5 is equal to the number of the third portions S21 of the second traces S2 contained in the sixth sub-pixel P6, and the number of the fourth portions S22 of the second traces S2 contained in the fifth sub-pixel P5 is equal to the number of the fourth portions S22 of the second traces S2 contained in the sixth sub-pixel P6, so as to further ensure the consistency of a wiring layout in the fifth sub-pixel P5 and the sixth sub-pixel P6.

As mentioned above, in the embodiment of the present disclosure, the second traces S2 are used for making up a defect, which an uneven distribution of traces is caused by setting up the first traces S1 in the display area, by setting the second traces S2 located in the second sub-pixel P2 and extending along the first direction D1 to overlap with the extension line(s) of the first traces S1 located in the first sub-pixel P1 and extending along the first direction D1, and setting the total number of the first traces S1 and the second traces S2 extending along the first direction D1 in the third sub-pixel P3 to be greater than or equal to the total number of the first traces S1 and the second traces S2 extending along the first direction D1 in the fourth sub-pixel P4, thereby improving the uniformity of trace distribution in the display area, so that it is advantageous to improve the display quality of the display panel.

It should be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A display panel, comprising a display area and a non-display area adjacent to the display area, wherein the display panel comprises:
   a substrate; and
   a driving circuit layer disposed on the substrate, the driving circuit layer comprising:
      a plurality of data lines located in the display area and extending along a first direction; and
      a plurality of first traces located at least partially in the display area and electrically connected to the data lines and a driving chip,
      wherein a connecting hole(s) of the first traces and the data lines is located in the display area, and
      wherein the driving circuit layer further comprises a plurality of second traces located in the display area and electrically insulated from the driving chip and the first traces, and extension lines of the first traces extending along the first direction overlap at least part of the second traces.

2. The display panel of claim 1, wherein a number of the connecting hole(s) of each of the first traces and each of the data lines is greater than or equal to 1.

3. The display panel of claim 1, wherein orthographic projections of the first traces, which are located in the display area and extend along the first direction, projected on a layer where the data lines are located overlap the data lines.

4. The display panel of claim 1, wherein lengths of the first traces are equal to each other in the display area.

5. The display panel of claim 1, wherein the display panel comprises a first sub-pixel and a second sub-pixel, which are arranged along the first direction, the first sub-pixel comprises at least one of the first traces extending along the first direction, the second sub-pixel comprises at least one of the second traces extending along the first direction, and one or more of the second traces located in the second sub-pixel and extending along the first direction overlap the extension line(s) of one or more of the first traces located in the first sub-pixel and extending along the first direction; and
   the display panel further comprises a third sub-pixel and a fourth sub-pixel, which are arranged along a second direction, and a total number of the first traces and the second traces extending along the first direction contained in the third sub-pixel is greater than or equal to a total number of the first traces and the second traces extending along the first direction contained in the fourth sub-pixel.

6. The display panel of claim 5, wherein the third sub-pixel comprises at least one of the first traces extending along the second direction, the fourth sub-pixel comprises at least one of the second traces extending along the second direction, and one or more of the second traces located in the fourth sub-pixel and extending along the second direction overlap the extension line(s) of one or more of the first traces located in the third sub-pixel and extending along the second direction.

7. The display panel of claim 6, wherein a total number of the first traces and the second traces extending along the second direction contained in the first sub-pixel is greater than or equal to a total number of the first traces and the second traces extending along the second direction contained in the second sub-pixel.

8. The display panel of claim 5, wherein a number of the first traces extending along the first direction contained in the third sub-pixel is greater than a number of the first traces extending along the first direction contained in the fourth sub-pixel, and a number of the second traces extending along the first direction contained in the third sub-pixel is less than a number of the second traces extending along the first direction contained in the fourth sub-pixel.

9. The display panel of claim 8, wherein the total number of the first traces and the second traces extending along the first direction contained in the third sub-pixel is equal to the total number of the first traces and the second traces extending along the first direction contained in the fourth sub-pixel.

10. The display panel of claim 5, wherein a number of the first traces extending along the second direction contained in the third sub-pixel is greater than a number of the first traces extending along the second direction contained in the fourth sub-pixel, and a number of the second traces extending along the second direction contained in the third sub-pixel is less than a number of the second traces extending along the second direction contained in the fourth sub-pixel.

11. The display panel of claim 10, wherein a total number of the first traces and the second traces extending along the second direction contained in the third sub-pixel is equal to a total number of the first traces and the second traces extending along the second direction contained in the fourth sub-pixel.

12. The display panel of claim 5, wherein a number of the first traces extending along the first direction contained in the first sub-pixel is greater than a number of the first traces extending along the first direction contained in the second sub-pixel, and a number of the second traces extending along the first direction contained in the first sub-pixel is less than a number of the second traces extending along the first direction contained in the second sub-pixel.

13. The display panel of claim 12, wherein a total number of the first traces and the second traces extending along the first direction contained in the first sub-pixel is equal to a total number of the first traces and the second traces extending along the first direction contained in the second sub-pixel.

14. The display panel of claim 5, wherein a number of the first traces extending along the second direction contained in the first sub-pixel is greater than a number of the first traces extending along the second direction contained in the second sub-pixel, and a number of the second traces extending along the second direction contained in the first sub-pixel is less than a number of the second traces extending along the second direction contained in the second sub-pixel.

15. The display panel of claim 14, wherein a total number of the first traces and the second traces extending along the second direction contained in the first sub-pixel is equal to a total number of the first traces and the second traces extending along the second direction contained in the second sub-pixel.

16. The display panel of claim 5, wherein the display panel further comprises a fifth sub-pixel and a sixth sub-pixel, which are arranged along the first direction, and the second traces located in the sixth sub-pixel and extending along the first direction overlap extension lines of the second traces located in the fifth sub-pixel and extending along the first direction.

17. The display panel of claim 5, wherein the display panel further comprises a seventh sub-pixel and an eighth sub-pixel, which are arranged along the second direction, and the second traces located in the eighth sub-pixel and extending along the second direction overlap extension lines of the second traces located in the seventh sub-pixel and extending along the second direction.

18. The display panel of claim 5, wherein the first traces and the second traces are located in a same metal layer in the driving circuit layer.

19. The display panel of claim 1, wherein the display panel further comprises a light-emitting layer disposed on the driving circuit layer, the light-emitting layer comprises a positive electrode; and a distance between an edge of an orthographic projection of the positive electrode projected on the driving circuit layer and the connecting hole(s) is greater than 0.

* * * * *